(12) United States Patent
Crowne et al.

(10) Patent No.: US 12,009,812 B2
(45) Date of Patent: Jun. 11, 2024

(54) OPTICALLY SWITCHED IGBT

(71) Applicant: Simmonds Precision Products, Inc., Vergennes, VT (US)

(72) Inventors: David H. Crowne, Weybridge, VT (US); Richard A. Poisson, Avon, CT (US); Scott R. Durkee, New Haven, VT (US)

(73) Assignee: Simmonds Precision Products, Inc., Vergennes, VT (US)

( * ) Notice: Subject to any disclaimer, the term of this patent is extended or adjusted under 35 U.S.C. 154(b) by 451 days.

(21) Appl. No.: 17/474,835

(22) Filed: Sep. 14, 2021

(65) Prior Publication Data

US 2022/0094357 A1   Mar. 24, 2022

Related U.S. Application Data

(60) Provisional application No. 63/082,210, filed on Sep. 23, 2020.

(51) Int. Cl.
| | |
|---|---|
| *H03K 17/785* | (2006.01) |
| *G02B 6/42* | (2006.01) |
| *H01L 31/11* | (2006.01) |
| *H03K 17/16* | (2006.01) |
| *H04B 10/25* | (2013.01) |

(52) U.S. Cl.
CPC ......... *H03K 17/785* (2013.01); *G02B 6/4295* (2013.01); *H01L 31/11* (2013.01); *H03K 17/168* (2013.01); *H04B 10/25* (2013.01)

(58) Field of Classification Search
CPC .. H03K 17/785; H03K 17/168; H03K 17/795; G02B 6/4295; H01L 31/11; H01L 31/1136; H01L 31/1105; H04B 10/25
See application file for complete search history.

(56) References Cited

U.S. PATENT DOCUMENTS

| | | | | |
|---|---|---|---|---|
| 5,196,911 A | * | 3/1993 | Wu | ......... H01L 31/202 |
| | | | | 257/53 |
| 5,610,409 A | * | 3/1997 | Leas | ......... H01L 31/1126 |
| | | | | 257/187 |
| 5,844,248 A | | 12/1998 | Yang | |
| (Continued) | | | | |

FOREIGN PATENT DOCUMENTS

| | | |
|---|---|---|
| CN | 1191394 A | 8/1998 |
| CN | 109412396 A | 3/2019 |
| JP | 2002-057390 A | 2/2002 |

OTHER PUBLICATIONS

Jose Manuel Gonzalez, et al., "Zero-bias Optically Controlled RF Switch in 0.13 um CMOS Technology", Microwave Photonics, 2011 International Topical Meeting On Microwave Photonics Conference, Oct. 18, 2011, pp. 441-444.

(Continued)

*Primary Examiner* — Victor A Mandala
(74) *Attorney, Agent, or Firm* — Kinney & Lange, P.A.

(57) ABSTRACT

A switching device includes an insulated gate bipolar transistor (IGBT) or MOSFET having a gate, an emitter, and a collector configured to allow current to pass between the emitter and the collector based on voltage applied to the gate. A stack of alternating layers of photo-sensitive p-n junction layers and insulating layers stacked on the gate for optical switching control of voltage through the IGBT or MOSFET.

16 Claims, 3 Drawing Sheets

(56) References Cited

U.S. PATENT DOCUMENTS

| | | | |
|---|---|---|---|
| 2005/0167709 A1* | 8/2005 | Augusto | H01L 27/14669 |
| | | | 257/292 |
| 2019/0214520 A1* | 7/2019 | Helava | H01L 31/162 |
| 2020/0220036 A1* | 7/2020 | Azize | H01L 31/1123 |

OTHER PUBLICATIONS

Mazumder Sudip K, "An Overview of Photonic Power Electronic Devices", IEEE Transactions on Power Electronics, Institute of Electrical and Electronics Engineers, vol. 31, No. 9, Jan. 9, 2016, pp. 6562-6574.

Extended European Search Report dated Feb. 23, 2022, issued during the prosecution of European Patent Application No. EP 21198326.7, 8 pages.

\* cited by examiner

OPTICALLY SWITCHED IGBT

CROSS REFERENCE TO RELATED APPLICATIONS

This application claims the benefit of U.S. Provisional Patent Application No. 63/082,210, filed Sep. 23, 2020. The entire contents of this application are incorporated herein by reference.

BACKGROUND

1. Field

The present disclosure relates to switching devices, and more particularly to IGBT devices and the like.

2. Description of Related Art

High power MOSFETs and Insulated Gate Bipolar Transistors (IGBTs) are used for control of high voltage/current devices, especially motors. Motor control signals are generally created in logic devices, such as microprocessors, Programmable Logic Devices and Gate Arrays. In general, these devices create logic level signals that must be translated to satisfy the higher voltage and current needed to switch IGBT's and MOSFETs. Isolated gate driver integrated circuits are commonly available to make this translation and optimally drive the gate of the power switching device.

This basic structure (controller, gate driver, power switching device) imposes an architecture which is acceptable for some applications and environments but not for others. Motors, for instance, create EMI (electro-magnetic interference) or may operate in high EMI environments. This means that the control logic and motor control signals must be protected from that environment.

In general, the high power part of the circuit (MOSFET, IGBT, high voltage source, motor) are not particularly susceptible to EMI, HIRF and lightning. They can also be optimized to work in high temperature environments. Complex logic can and has been designed for these environments but this is not always optimal. Protection means must be taken and reliability will not always be optimal. The other conventional technology alternative is to keep the control logic in a remote location and run electrical conductors to the switching elements. This exposes the wiring to the EMI and HIRF (high-intensity radiated field) environment, making the control signals susceptible to noise and corruption. Thus, precautions and countermeasures must be taken, typically in the form of electrical shielding. This adds weight and introduces other reliability issues.

Aircraft are becoming more electric and their control more integrated. For instance, architectures where control means are implemented in Integrated Modular Avionics and the effectors are electrical include, for example, electrically actuated brakes, electrically actuated flight controls, high power pumps for jet fuel/engine control, and multiple open loop motor control from a single controller. At the same time, airframes are less protective against EMI/HIRF/lightning effects as they are increasingly constructed from composite materials.

The conventional techniques have been considered satisfactory for their intended purpose. However, there is an ever present need for improved systems and methods for applications such as those discussed above. This disclosure provides a solution for this need.

SUMMARY

A switching device includes an insulated gate bipolar transistor (IGBT) or MOSFET having a gate, an emitter, and a collector configured to allow current to pass between the emitter and the collector based on voltage applied to the gate. A stack of alternating layers of photo-sensitive p-n junction layers and insulating layers stacked on the gate for optical switching control of voltage through the IGBT or MOSFET.

Positive terminals of the photosensitive p-n junction layers can be electrically connected to the gate. Negative terminals of the photosensitive p-n junction layers can be electrically connected to the emitter. This can allow switching the IGBT or MOSFET to allow current flow between collector and the emitter when the photosensitive p-n junction layers are exposed to photonic energy.

The stack can be epitaxially grown on the gate. A bottom contact and reflector layer can connect the stack to the gate. The bottom contact and reflector layer can have a thickness on order with that of one of the photo-sensitive p-n junction layers. A top transparent or filter layer can be stacked on the stack opposite from the gate. It is also contemplated the gate can include a polished surface, and wherein the stack is stacked directly on the gate.

An optical interface can be operatively connected to be controlled by control logic. The optical interface can include a illuminator. An optical fiber can optically connect between the illuminator and the stack so the control logic can control current flow between the collector and the emitter. A load and a voltage source can be operatively connected to the emitter and the collector to allow current flow from the voltage source to the load when current flow in the IGBT or MOSFET is switched on.

A system includes an IGBT or MOSFET as described above. The system includes control logic having a first waveform controller and a second waveform controller. An optical interface is operatively connected to be controlled by the control logic. The optical interface includes a first illuminator operatively connected to the first waveform generator and a second illuminator operatively connected to the second waveform generator. A first optical fiber optically connects between the first illuminator and the stack of the IGBT or MOSFET. A second optical fiber optically connects between the second illuminator and the stack so the control logic can control current flow between the collector and the emitter redundantly with the first and second optical fibers.

A system includes a plurality of switching devices, an IGBT or MOSFET as described above. The system includes control logic having a plurality of waveform controllers. An optical interface is operatively connected to be controlled by the control logic. The optical interface includes a plurality of illuminators each operatively connected to a respective one of the plurality of waveform controllers, each of the plurality of illuminators being of a different wavelength. A respective initial optical fiber optically connects between each of the plurality of illuminators and an optical combiner. A main optical fiber connects between the initial optical fibers and an optical splitter. A respective terminal optical fiber is included, each optically connecting between the optical splitter and a respective one of the stacks so the control logic can control current flow for all of the IGBTs or MOSFETs independently. Each stack can include a wavelength-selective optical filter that only allows it to operate when illuminated by light in a particular wavelength range These and other features of the systems and methods of the subject disclosure will become more readily apparent to those skilled in the art from the following detailed description of the preferred embodiments taken in conjunction with the drawings.

BRIEF DESCRIPTION OF THE DRAWINGS

So that those skilled in the art to which the subject disclosure appertains will readily understand how to make and use the devices and methods of the subject disclosure without undue experimentation, preferred embodiments thereof will be described in detail herein below with reference to certain figures, wherein.

DETAILED DESCRIPTION OF THE PREFERRED EMBODIMENTS

Figure 1:
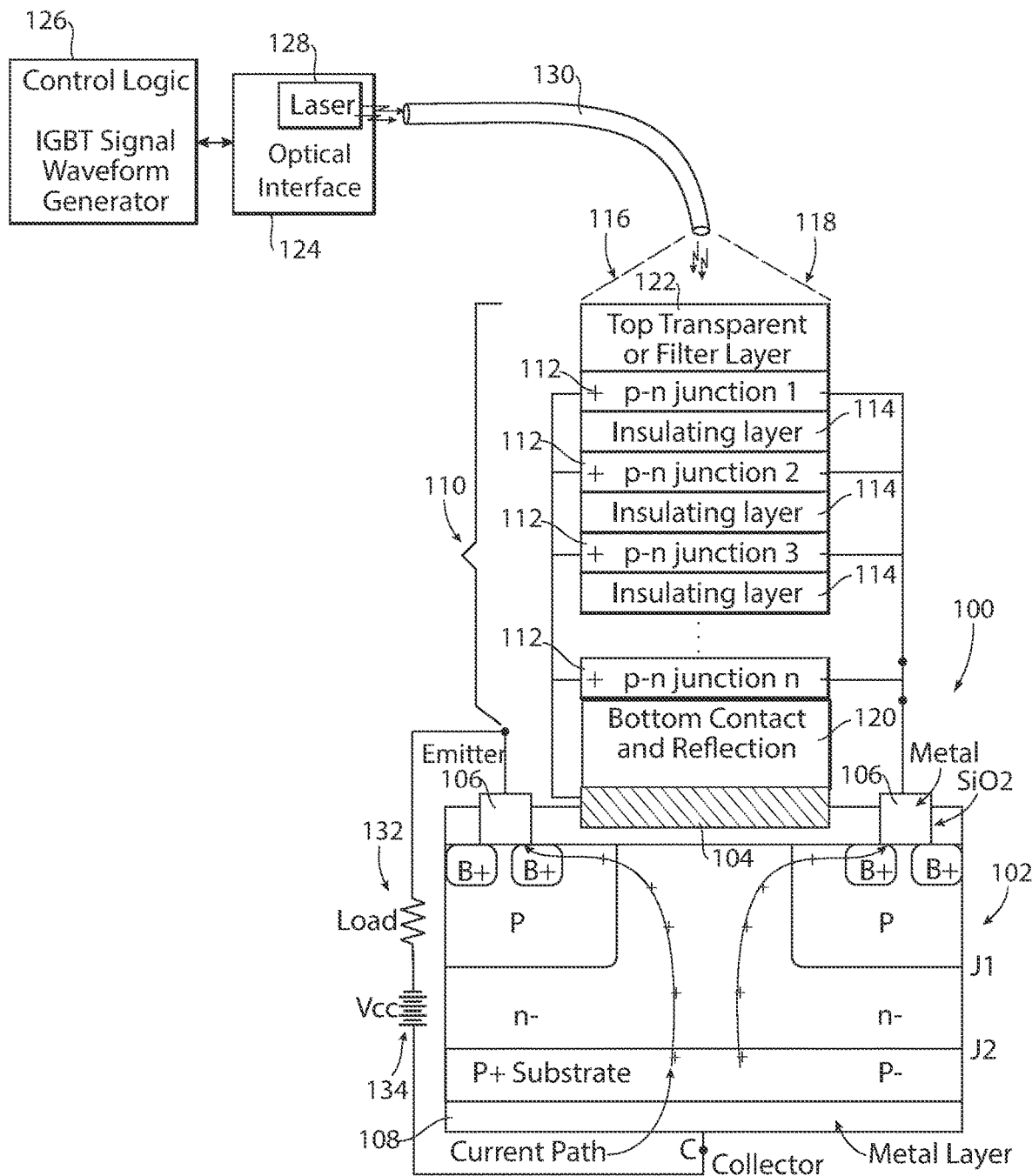
FIG. 1 is a schematic view of an embodiment of a switching device constructed in accordance with the present disclosure, showing the stack on the gate.

Reference will now be made to the drawings wherein like reference numerals identify similar structural features or aspects of the subject disclosure. For purposes of explanation and illustration, and not limitation, a partial view of an embodiment of a switching device in accordance with the disclosure is shown in FIG. 1 and is designated generally by reference character 100. Other embodiments of systems in accordance with the disclosure, or aspects thereof, are provided in FIGS. 2-3, as will be described. The systems and methods described herein can be used to optically switch electrical currents, such as use in aircraft for control of electric motors and the like.

The switching device 100 includes an insulated gate bipolar transistor (IGBT) or MOSFET 102 having a gate 104, an emitter 106, and a collector 108 configured to allow electrical current to pass between the emitter 106 and the collector 108 based on voltage applied to the gate 104. A stack 110 of alternating layers of photo-sensitive p-n junction layers 112 and insulating layers 114 stacked on the gate 104 for optical switching control of voltage through the IGBT or MOSFET 102.

Positive terminals 116 of the photosensitive p-n junction layers are electrically connected to the gate 104. Negative terminals 118 of the photosensitive p-n junction layers are electrically connected to the emitter 106 (e.g. the emitter 106 is a ring around the gate 104, but any other suitable configuration of emitter and gate is also contemplated). This allows switching the IGBT or MOSFET 102 to allow current flow between the collector 108 and the emitter 106 when the photosensitive p-n junction layers 112 are exposed to photonic energy.

The 110 stack can be epitaxially grown on the gate 104, and can include a bottom contact and reflector layer 120 that electrically connects the stack to the gate 104. The bottom contact and reflector layer 120 has a thickness on the order with that of one of the photo-sensitive p-n junction layers 112, i.e., the thickness of the bottom contact and reflector layer 102 has a thickness that is within a factor of ten of that of one of the p-n junction layers 112. It is also contemplated in lieu of the bottom contact and reflector layer 120, the gate 104 can include a polished upper surface as oriented in FIG. 1, wherein the stack 110 is stacked directly on the gate 104. A top transparent or filter layer 122 is stacked on the stack 110 opposite from the gate 104.

An optical interface 124 is operatively connected to be controlled by control logic 126, which includes an IGBT or MOSFET signal waveform generator for controlling the optical interface 124. The optical interface 124 includes a illuminator 128. An optical fiber 130 optically connects between the illuminator 128 and the stack 110 so the control logic 126 can control current flow between the collector 108 and the emitter 106 using photonic illumination from the illuminator 228 on the stack 110. A load 132, e.g. a phase winding of an electric motor or other suitable load, and a voltage source 134 are operatively connected to the emitter 106 and the collector 108 to allow current flow from the voltage source 134 to the load 132 when current flow in the IGBT or MOSFET 102 is switched on.

Figure 2:
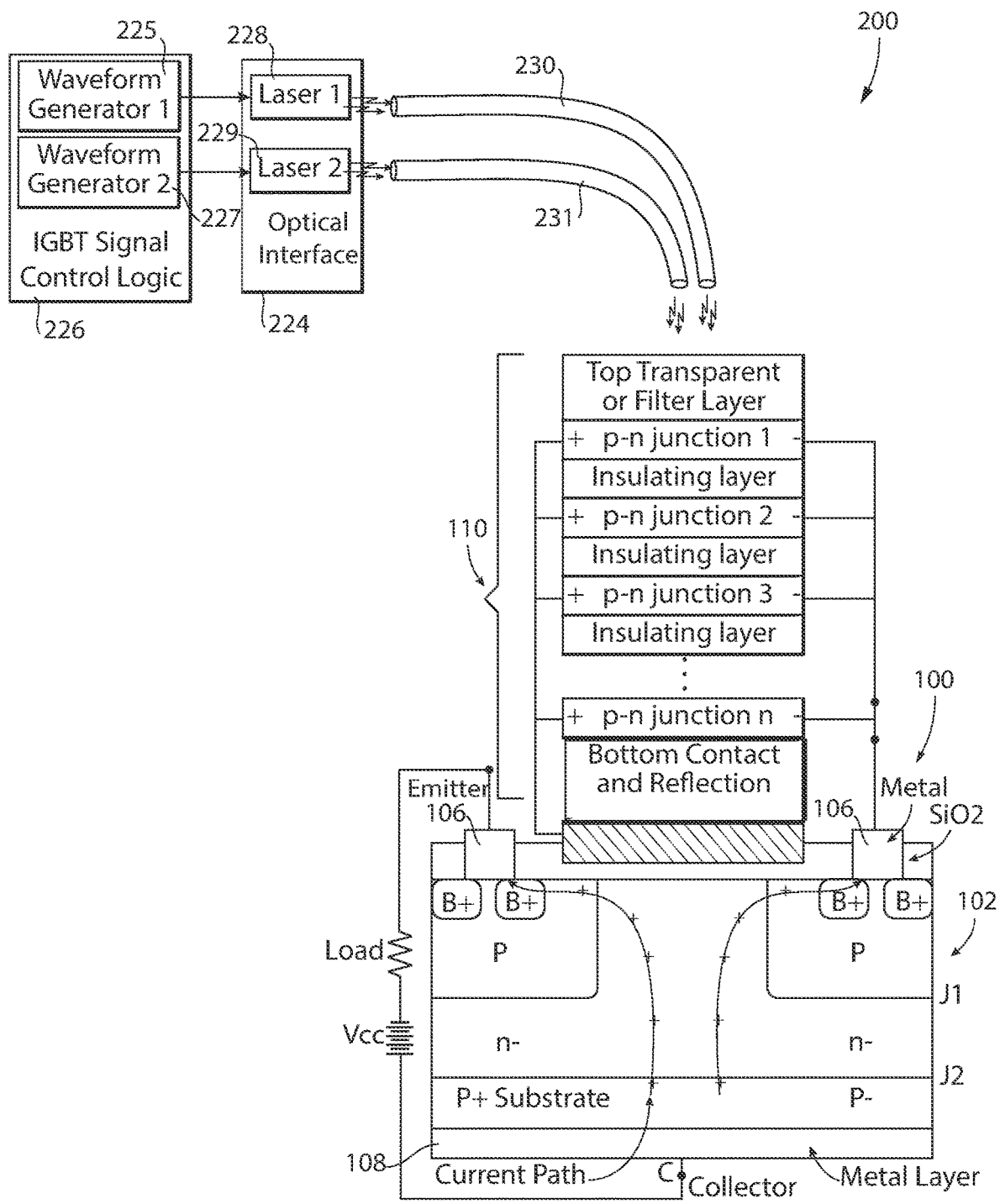
FIG. 2 is a schematic view of the switching device of FIG. 1, showing two optical fibers connected to control the switching for redundancy.

With reference now to FIG. 2, a system 200 includes an IGBT or MOSFET 102 as described above. The system 200 includes control logic 226 having a first waveform controller 225 and a second waveform controller 227. An optical interface 224 is operatively connected to be controlled by the control logic 226. The optical interface 224 includes a first illuminator 228 operatively connected to the first waveform generator 225 and a second illuminator 229 operatively connected to the second waveform generator 227. A first optical fiber 230 optically connects between the first illuminator 228 and the stack 110 of the IGBT or MOSFET 102. A second optical fiber 231 optically connects between the second illuminator 229 and the stack 110 so the control logic 226 can control current flow between the collector 108 and the emitter 106 redundantly with photonic illumination from the first and second optical fibers 230, 231. This can provide reduncance, e.g. in case one of the optical fibers 230, 231 becomes inoperative, e.g. is severed or damaged.

Figure 3:
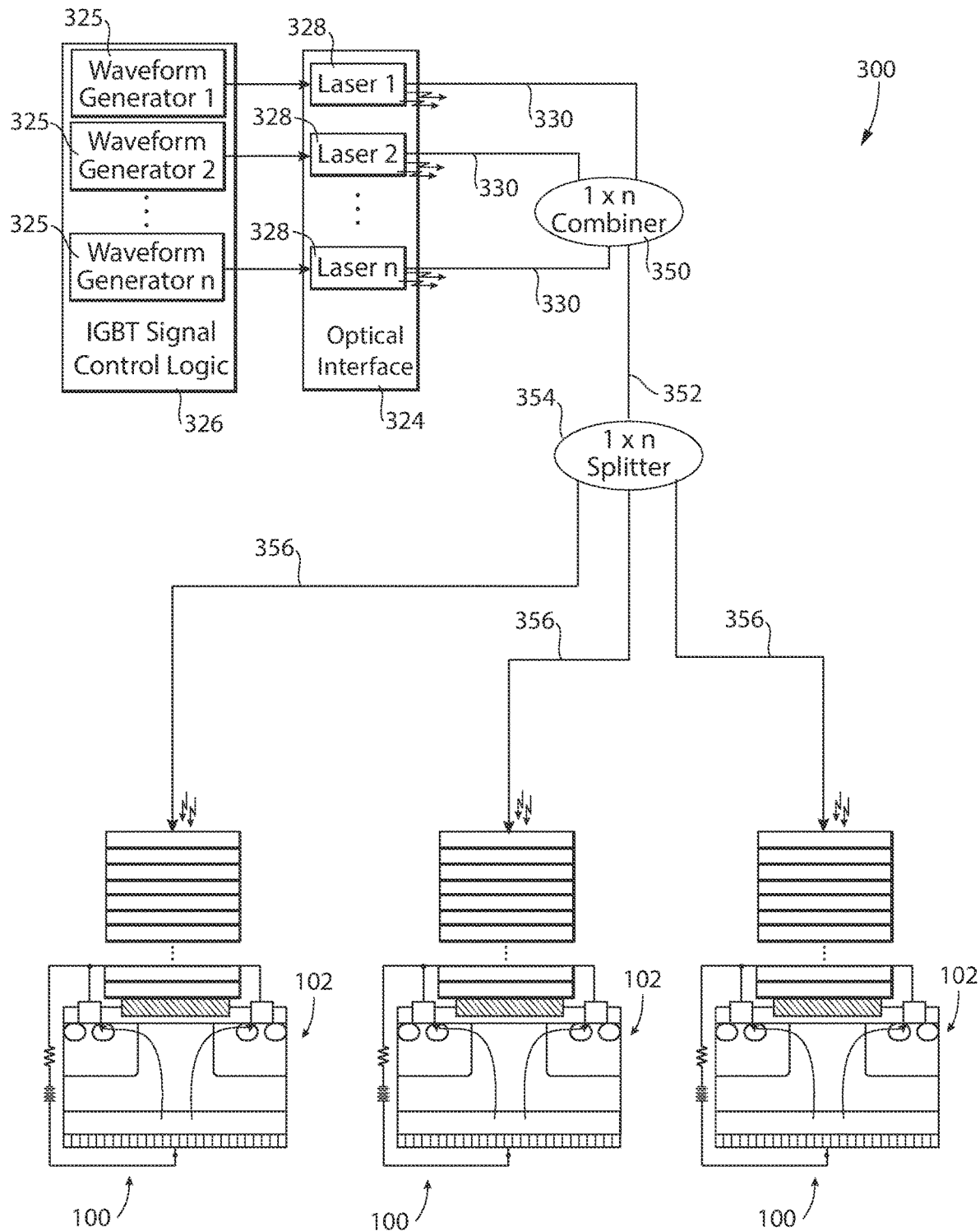
FIG. 3 is a schematic view of a plurality of switching devices like that shown in FIG. 1, showing a network of optical fibers for controlling the switching devices.

With reference now to FIG. 3, a system 300 includes a plurality of switching devices 100, each including an IGBT or MOSFET 102 as described above. The system includes control logic having a plurality of waveform controllers. An optical interface 324 is operatively connected to be controlled by the control logic 326. The optical interface 324 includes a plurality of illuminators 328 each operatively connected to a respective one of the plurality of waveform controllers 325. Each of the plurality of illuminators 328 is of a different wavelength from the others. A respective initial optical fiber 330 optically connects between each of the plurality of illuminators 328 and an optical combiner 350. A main optical fiber 352 connects between the initial optical fibers 330 and an optical splitter 354. A respective terminal optical fiber 356 is included, each optically connecting between the optical splitter 354 and a respective one of the stacks 110 so the control logic 326 can control current flow for all of the IGBTs or MOSFETs 102 independently. Illuminators as disclosed herein can include lasers or any other suitable light or illumination source.

Each stack, e.g. stack 110 in FIG. 1, in the system 300 can include a wavelength-selective optical filter, e.g. filter layer 122 of FIG. 1, that only allows it to operate when illuminated by light in a particular wavelength range. When the filter of each stack is different from one another among the stacks, wavelength multiplexing can be used in an optical fiber network as disclosed herein.

The combiner 350 combines the signals of all the illuminators 228 into a single fiber 352, and the splitter 354 separates the signals back into individual respective fibers 356. This optical fiber network allows for a long distance to be crossed only by a single fiber 352 instead of multiple fibers 330. Those skilled in the art will readily appreciate that the example of having three illuminators 328 and three IGBTs or MOSFETs 102 is exemplary for illustrative purposes, and any suitable number of IGBTs or MOSFETs can be controlled by this system. It is also contemplated that that each IGBT or MOSFET 102 in the system 300 can have the benefit of the redundancy of FIG. 2, e.g. by running two main optical fibers 352.

The methods and systems of the present disclosure, as described above and shown in the drawings, provide for optical switching in electrical applications, e.g. for more electric aircraft. While the apparatus and methods of the subject disclosure have been shown and described with reference to preferred embodiments, those skilled in the art will readily appreciate that changes and/or modifications may be made thereto without departing from the scope of the subject disclosure.

What is claimed is:

1. A switching device comprising:
    an insulated gate bipolar transistor (IGBT) or MOSFET having a gate, an emitter, and a collector configured to allow current to pass between the emitter and the collector based on voltage applied to the gate; and
    a stack of alternating layers of photo-sensitive p-n junction layers and insulating layers stacked on the gate for optical switching control of voltage through the IGBT or MOSFET.

2. The switching device as recited in claim 1, wherein positive terminals of the photosensitive p-n junction layers are electrically connected to the gate, and negative terminals of the photosensitive p-n junction layers are electrically connected to the emitter to switch the IGBT or MOSFET to allow current flow between collector and the emitter when the photosensitive p-n junction layers are exposed to photonic energy.

3. The switching device as recited in claim 1, wherein the stack is epitaxially grown on the gate.

4. The switching device as recited in claim 1, further comprising a bottom contact and reflector layer connecting the stack to the gate.

5. The switching device as recited in claim 4, wherein the bottom contact and reflector layer has a thickness on order with that of one of the photo-sensitive p-n junction layers.

6. The switching device as recited in claim 1, further comprising a top transparent or filter layer stacked on the stack opposite from the gate.

7. The switching device as recited in claim 1, further comprising:
    control logic;
    an optical interface operatively connected to be controlled by the control logic, wherein the optical interface includes a illuminator; and
    an optical fiber optically connecting between the illuminator and the stack so the control logic can control current flow between the collector and the emitter.

8. The switching device as recited in claim 1, further comprising a load and a voltage source operatively connected to the emitter and the collector to allow current flow from the voltage source to the load when current flow in the IGBT or MOSFET is switched on.

9. The switching device as recited in claim 1, wherein the gate includes a polished surface, and wherein the stack is stacked directly on the gate.

10. A system comprising:
    an insulated gate bipolar transistor (IGBT) or MOSFET having a gate, an emitter, and a collector configured to allow current to pass between the emitter and the collector based on voltage applied to the gate;
    a stack of alternating layers of photo-sensitive p-n junction layers and insulating layers stacked on the gate for optical switching control of voltage through the IGBT or MOSFET;
    control logic, including a first waveform controller and a second waveform controller;
    an optical interface operatively connected to be controlled by the control logic, wherein the optical interface includes a first illuminator operatively connected to the first waveform generator and a second illuminator operatively connected to the second waveform generator;
    a first optical fiber optically connecting between the first illuminator and the stack; and
    a second optical fiber optically connecting between the second illuminator and the stack so the control logic can control current flow between the collector and the emitter redundantly with the first and second optical fibers.

11. The system as recited in claim 10, further comprising a bottom contact and reflector layer connecting the stack to the gate.

12. The system as recited in claim 10, wherein the gate includes a polished surface, and wherein the stack is stacked directly on the gate without an intervening conductor.

13. A system comprising
    a plurality of switching devices, each including:
        an insulated gate bipolar transistor (IGBT) or MOSFET having a gate, an emitter, and a collector configured to allow current to pass between the emitter and the collector based on voltage applied to the gate; and
        a stack of alternating layers of photo-sensitive p-n junction layers and insulating layers stacked on the gate for optical switching control of voltage through the IGBT or MOSFET;
    control logic, including a plurality of waveform controllers;
    an optical interface operatively connected to be controlled by the control logic, wherein the optical interface includes a plurality of illuminators each operatively connected to a respective one of the plurality of waveform controllers, each of the plurality of illuminators being of a different wavelength;
    a respective initial optical fiber optically connecting between each of the plurality of illuminators and an optical combiner;
    a main optical fiber connecting between the initial optical fibers and an optical splitter; and
    a respective terminal optical fiber optically each connecting between the optical splitter and a respective one of the stacks so the control logic can control current flow for all of the IGBTs or MOSFETs independently.

14. The system as recited in claim 13, further comprising for each of the switching devices, a bottom contact and reflector layer connecting the stack to the gate.

15. The system as recited in claim 13, wherein each gate includes a polished surface, and wherein the stack is stacked directly on the gate without an intervening conductor.

16. The system as recited in claim 13, wherein each stack includes a wavelength-selective optical filter that only allows it to operate when illuminated by light in a particular wavelength range.

* * * * *